United States Patent
Yang et al.

(10) Patent No.: US 9,343,377 B1
(45) Date of Patent: May 17, 2016

(54) TEST THEN DESTROY TECHNIQUE FOR SECURITY-FOCUSED SEMICONDUCTOR INTEGRATED CIRCUITS

(71) Applicant: Google Inc., Mountain View, CA (US)

(72) Inventors: Andy Yang, Cupertino, CA (US); Benjamin Iver Gribstad, Mountain View, CA (US); Don Stark, Mountain View, CA (US); Shahriar Rabii, Palo Alto, CA (US); Srenik Mehta, Freemon, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/592,249

(22) Filed: Jan. 8, 2015

(51) Int. Cl.
*H01L 21/66* (2006.01)
*H01L 21/82* (2006.01)
*H01L 21/768* (2006.01)

(52) U.S. Cl.
CPC .......... *H01L 22/10* (2013.01); *H01L 21/76892* (2013.01); *H01L 21/82* (2013.01)

(58) Field of Classification Search
CPC .... H01L 21/76892; H01L 21/82; H01L 22/10
See application file for complete search history.

(56) References Cited

U.S. PATENT DOCUMENTS

| 5,206,181 | A | 4/1993 | Gross |
| 6,036,809 | A | 3/2000 | Kelly et al. |
| 7,705,267 | B2 | 4/2010 | Heyl |
| 2003/0124816 | A1* | 7/2003 | Potts ............. H01L 22/34 438/462 |
| 2008/0061817 | A1 | 3/2008 | Erickson et al. |
| 2011/0050267 | A1* | 3/2011 | Pagani ............. G01R 1/07307 324/756.03 |
| 2013/0299589 | A1 | 11/2013 | Finn |
| 2013/0342231 | A1 | 12/2013 | Alfano et al. |

FOREIGN PATENT DOCUMENTS

WO 2014/110143 7/2014

* cited by examiner

*Primary Examiner* — Mamadou Diallo
(74) *Attorney, Agent, or Firm* — Young Basile Hanlon & MacFarlane P.C.

(57) ABSTRACT

A method includes forming an integrated circuit device having device circuitry disposed in a device circuitry area on a substrate and a destroyable circuit formed in a destroyable circuitry area on the substrate; testing at least one operational aspect of the device circuitry using the destroyable circuit; and destroying the destroyable circuit subsequent to testing the at least one operational aspect of the device circuitry.

20 Claims, 11 Drawing Sheets

TEST THEN DESTROY TECHNIQUE FOR SECURITY-FOCUSED SEMICONDUCTOR INTEGRATED CIRCUITS

BACKGROUND

Computer systems are utilized by individuals and organizations to store and process sensitive information such as sensitive business documents, medical records, and financial account information. Unauthorized parties, commonly referred to as "hackers," attempt to gain access to this information for various reasons. As a result, information security is a top concern for many organizations and individuals today.

Hardware-based approaches to strengthening information security have gained popularity. For example, as a semiconductor authentication integrated circuit chip can contain sophisticated security protocols inside. Compared to software products, hardware at the semiconductor integrated circuit level usually is usually less susceptible to attacks by hackers, such as by way of malicious Trojans. Nevertheless, the hardware integrated circuit chips are not weakness-free and have their intrinsic vulnerabilities.

One vulnerability of a security-focused integrated circuit chip is its testing port, which is incorporated in the integrated circuit according to design for test (DFT) principles. One example of a testing port is a test access port (TAP) interface according to the IEEE 1149.1 standard. These testing ports are needed in integrated circuit manufacturing to screen out the process defects and confirm the chips are fully functional before shipping to the customers. If not properly protected, the testing port can be used by hackers as the interface to extract information from the IC chip, such as extract security keys and other private information. This information can be used, as an example, to develop a method for unauthorized access to other information systems that use the same authentication protocol.

SUMMARY

The disclosure relates generally to test then destroy techniques for semiconductor integrated circuits.

One aspect of the disclosed embodiments is a method that includes forming an integrated circuit device having device circuitry disposed in a device circuitry area on a substrate and a destroyable circuit formed in a destroyable circuitry area on the substrate; testing at least one operational aspect of the device circuitry using the destroyable circuit; and destroying the destroyable circuit subsequent to testing the at least one operational aspect of the device circuitry.

Another aspect of the disclosed embodiments is a method that includes forming a semiconductor wafer that includes a plurality of integrated circuit devices having device circuitry disposed in a device circuitry area on a substrate and a destroyable circuit formed in a destroyable circuitry area on the substrate; testing at least one operational aspect of the device circuitry of each of the integrated circuit devices using the destroyable circuit of the respective one of the integrated circuit devices; and destroying the destroyable circuit of each of the integrated circuit devices subsequent to testing the at least one operational aspect of the device circuitry.

BRIEF DESCRIPTION OF THE DRAWINGS

The description herein makes reference to the accompanying drawings wherein like reference numerals refer to like parts throughout the several views, and wherein.

DETAILED DESCRIPTION

According to the methods discussed herein, the testing port of an integrated circuit is eliminated as a potential source of information that can used by hackers to compromise information security systems by destroying the destroyable circuit that is formed on an integrated circuit device subsequent to testing at least one operational aspect of device circuitry that is formed on the integrated circuit device. As used herein, the terms "test" and testing" refer both to testing performed during manufacturing and debug testing performed during development. The methods herein can be applied to integrated circuits that are used to provide or enhance information security functions, and can be applied to other integrated circuits as well. Destroying the device controller is performed by any controllable process that can be contained within a destroyable circuitry area that is defined on the integrated circuit device. This can include partial or complete removal of a conductive interconnect layer of the destroyable circuit from the substrate, or can include partial or complete removal of the destroyable circuit in its entirety from the substrate. In instances where partial removal is utilized, the extent of the removal is sufficient to prevent reverse-engineering of security-vulnerable functions of the destroyable circuit.

Figure 1:
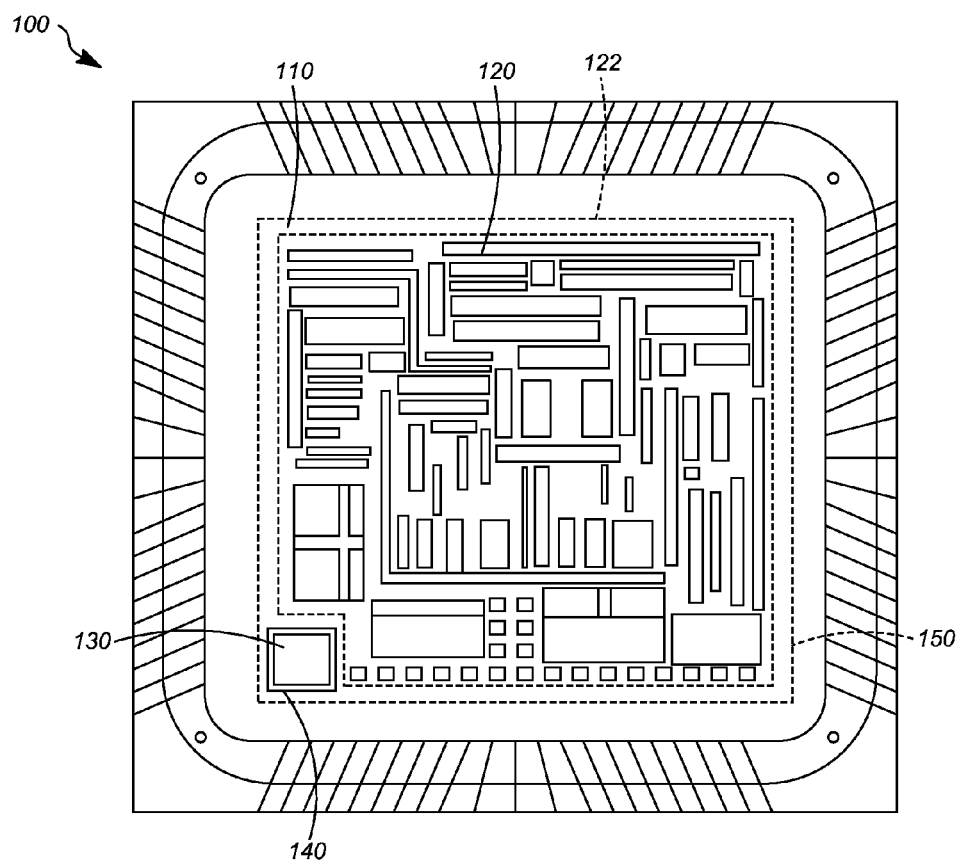
FIG. 1 is an illustration showing an integrated circuit device.

FIG. 1 shows an integrated circuit device 100. The integrated circuit device 100 includes circuitry formed on a substrate 110, as is well known in the art. The circuitry includes device circuitry 120 and test circuitry 130 that are formed on the substrate 110. The device circuitry 120 is the portion of the integrated circuit device 100 that performs the intended functions of the integrated circuit device 100. The device circuitry 120 is located in a device circuitry area 122. The device circuitry area can be separated from some or all of the test circuitry 130 by a sacrificial gap 140. The size of the sacrificial gap 140 is selected such that it is sufficient to prevent inadvertent destruction of the device circuitry 120. As an example, the width of the sacrificial gap 140 can be on the order of tens of microns.

The test circuitry 130 includes devices that are utilized to confirm correct operation of one or more operational aspects of the device circuitry. The test circuitry 130 is utilized only during the manufacturing process. Furthermore, the device circuitry 120 and the test circuitry 130 are configured such that operation of the device circuitry 120 during performance of its intended function is in no way dependent upon the test circuitry 130. As will be explained herein, this allows the test circuitry 130 to be destroyed prior to completion of the manufacturing process so that sensitive information cannot be obtained by probing, viewing, or otherwise reverse engineering the test circuitry 130 subsequent to completion of the manufacturing process.

The test circuitry 130 can be positioned adjacent to a seal ring 150 of the integrated circuit device 100, with the sacrificial gap 140 interposed between the test circuitry 130 and the seal ring 150. By positioning the sacrificial gap 140 between the sacrificial gap 140 and the test circuitry 130, the integrity of the seal ring 140 can be maintained during destruction of destroyable circuitry, as will be described herein. In the illustrated example, the test circuitry 130 is positioned at a corner of the integrated circuit device 100, with the test circuitry 130 being adjacent to the seal ring 150 on two sides. In an alternative implementation, a second seal ring is formed that surrounds the test circuitry 130, within or immediately adjacent to the sacrificial gap 140.

Figure 2:
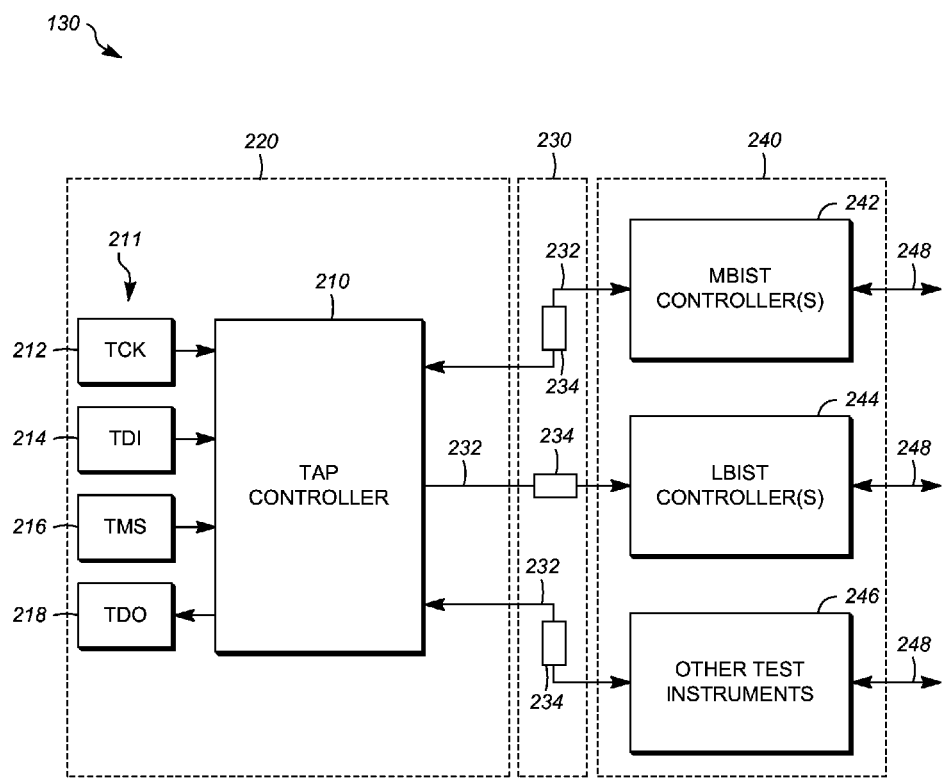
FIG. 2 is an illustration showing test circuitry of the integrated circuit device.

FIG. 2 is an illustration showing the test circuitry 130 of the integrated circuit device 100. The test circuitry 130 includes a destroyable circuit. The destroyable circuit will be described herein with reference to a testing controller, such as a TAP controller 210 according to the IEEE 1149.1 standard. It should be understood, however, that the methods described herein can be applied to other destroyable circuits, which are defined herein as circuit blocks that are security vulnerable and are not utilized during normal operation of the integrated circuit device 100 subsequent to completion of the manufacturing process. Examples include testing controllers, debug (testing) ports such as a SWDP (serial wire debug port), and memory access port associated with a 3rd-party IP that will not be used in during normal operation of the integrated circuit device 100 but are security vulnerable. All disclosure made herein with respect to testing controllers and the TAP controller 210 is likewise applicable to other destroyable circuits.

The TAP controller 210 is connected to a plurality of input/output terminals 211, such as a test clock (TCK) terminal 212, a test data input (TDI) terminal 214, a test mode select (TMS) terminal 216, and a test data output (TDO) terminal 218. The TAP controller 210 and the input/output terminals 211 are located in a destroyable circuitry area 220.

The TAP controller 210 can be connected to the device circuitry 120 through isolation cells 230 and one or more test instruments 240. The isolation cells 230 are operable to prevent thermal damage that could otherwise be carried to the device circuitry 120 via the testing interconnections 232 during destruction of the TAP controller 210, and to ensure drive safe values on floating inputs or shorted inputs after destruction of the TAP controller 210. The isolation cells 230 each include one or more isolating elements 234, which can be or include, as examples, e-fuses or pass-gates, that are located on the testing interconnections 232 between the TAP controller 210 and other circuitry, such as the test instruments 240 and the device circuitry 120. As an example, the plurality of testing interconnections 232 can each include an e-fuse as the isolating element 234, and the e-fuses are all blown prior to destruction of the TAP controller 210. As another example, the plurality of testing interconnections 232 can each include a pass-gate as the isolating element 234. As another example, the plurality of testing interconnections 232 can each include an e-fuse and a pass-gate as the isolating element 234, and the e-fuses are all blown prior to destruction of the TAP controller 210. The testing interconnections 232 can further include voltage sources and, optionally, circuit elements that provide appropriate voltage values, with these elements remaining intact subsequent to destruction of the TAP controller 210.

The test instruments 240 can include, as examples, a Logic Built-in Self Test (LBIST) controller 242, a Memory Built-in Self Test (MBIST) controller 244, and/or other test instruments 246. Each of these can be connected to the TAP controller 210 via the isolation cells 230, and can be connected to the device circuitry 120 by one or more device interconnections 248.

Figure 3:
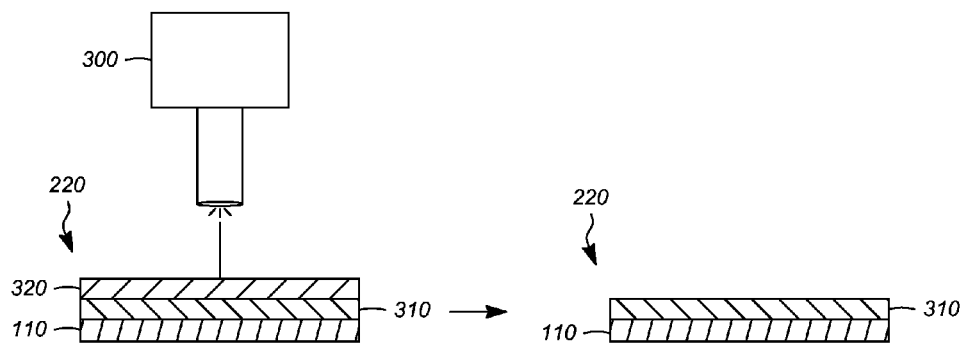
FIG. 3 is an illustration showing destruction of a test controller according to a first example.

FIG. 3 is an illustration showing destruction of a test controller such as the TAP controller 210 according to a first example. A laser 300 is utilized to destroy one or more structures in the destroyable circuitry area 220 of the integrated circuit device 100, such as the TAP controller 210 and/or the input/output terminals 211. In the illustrated example, one or more transistor layers 310 and one or more conductive interconnect layers 320 are formed on the substrate 110, as is well known in the art. The laser 300 is used to remove at least part of the conductive interconnect layers 320 by ablation within the destroyable circuitry area 220. This can include removing all of the conductive interconnections of the transistors of the TAP controller 210. Ablation is performed only inside the area bounded by the sacrificial gap 140, such as in the destroyable circuitry area 220. It should be understood that laser ablation is one example of a technique that can be used to destroy the destroyable circuits on the integrated circuit device 100. All destruction operations described herein as being performed with a laser and/or by laser ablation can be performed by any controllable physical and/or chemical destructive technique such as etching or milling.

The laser 300 can be, for example, an Ytterbium (Yb) fiber laser, Nd:YAG, or Nd:YVO crystal laser with a wavelength of 1064 nm. These types of lasers have been well studied and well accepted by the semiconductor industry, and present a very low risk of unknown laser-silicon interaction mechanisms. A wavelength of 1064 nm laser beam also provides a high photon absorption rate in silicon, and thus high ablation efficiency. The laser ablation described herein can be performed using the laser 300 in a few laser pulses with each pulse as short as 100 ns and high pulse repeat rate in the range of tens of kilohertz.

Figure 4:
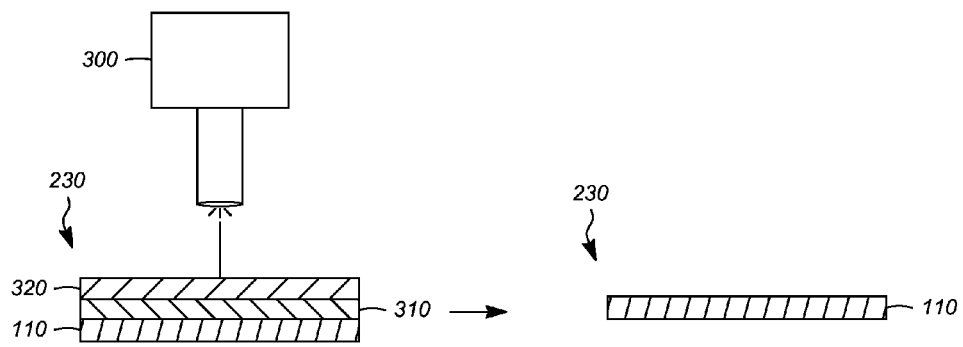
FIG. 4 is an illustration showing destruction of a test controller according to a second example.

FIG. 4 is an illustration showing destruction of a test controller such as the TAP controller 210 according to a second example. In this example, destruction of the TAP controller 210 is as described with respect to FIG. 3 except that the TAP controller 210 is removed in its entirety from the substrate 110 by removal of the transistor layer 310 and the conductive interconnect layer 320 from the substrate 110 by ablation using the laser 300. As a result, the substrate 110 can be free from portions of the finite-state machine (FSM) logic or floating input nodes of the TAP controller 210.

The examples in FIGS. 3-4 contemplate destruction of the test controller such as the TAP controller 210. It should be understood that the methods described herein could also be applied to destruction of the input/output terminals 211 without destruction of the test controller. This approach does not provide the level of security associated with destruction of the test controller, but does provide some security by forcing use of more sophisticated techniques by parties that would attempt to reverse engineer aspects of the testing controller.

Figure 5:
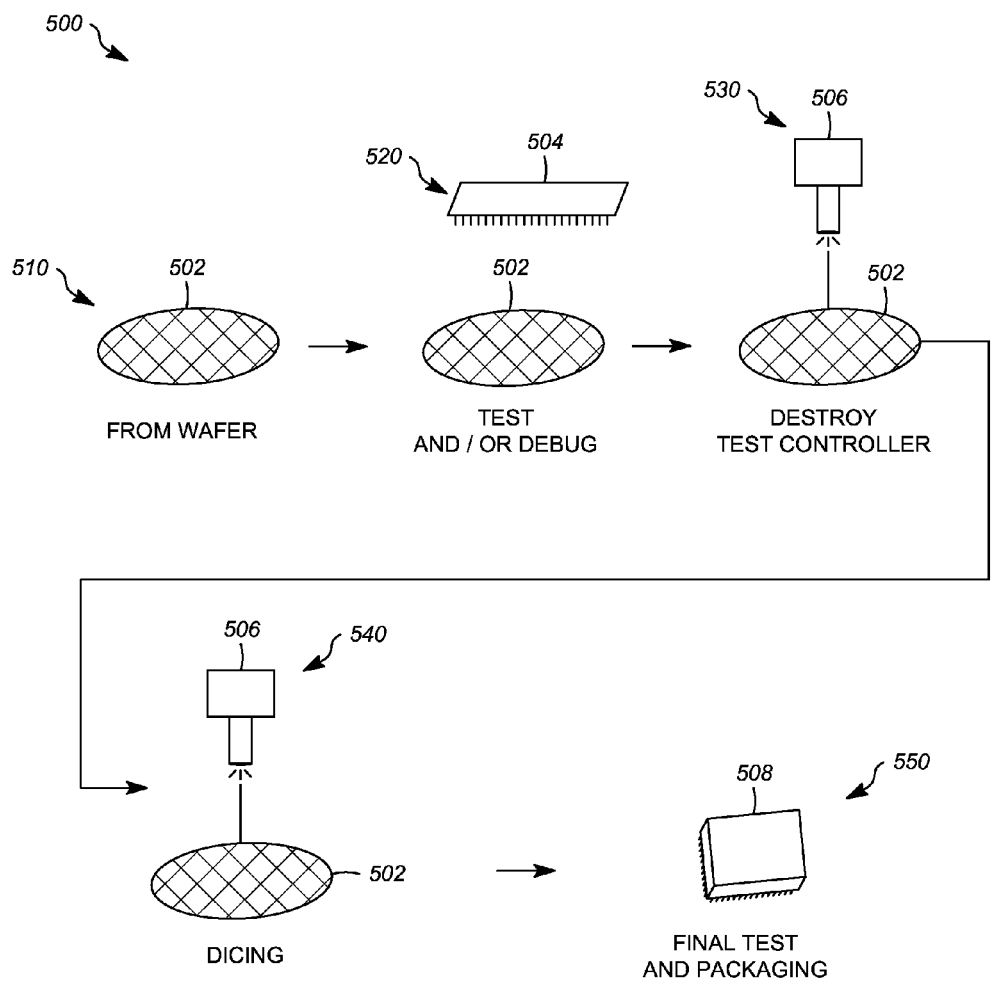
FIG. 5 is an illustration showing a process for forming and processing a semiconductor wafer according to a first example.

FIG. 5 is an illustration showing a process 500 for forming and processing a semiconductor wafer 502 according to a first example. In operation 510, the semiconductor wafer 502 is formed in a conventional manner. The semiconductor wafer 502 includes a plurality of integrated circuit devices such the integrated circuit device 100, each having device circuitry disposed in a device circuitry area on a substrate and a test controller formed in a destroyable circuitry area on the substrate.

In operation 520, at least one operational aspect of the device circuitry of each of the integrated circuit devices of the semiconductor wafer 502 is tested using the test controller of the respective one of the integrated circuit devices. In particular, automatic test equipment (ATE) 504 is connected to the test controller of each device on the semiconductor wafer 502 using test probes of the ATE 504 to engage probe pads on each device that interface with the input/output ports of each test controller. Electrical power and appropriate inputs are supplied to the test controllers by the ATE 504, and outputs are passed to the ATE 504 by the test controllers in response.

In operation 530, the test controllers of the integrated circuit devices on the semiconductor wafer 502 are destroyed using a laser 506. The laser 506 can be equivalent to the laser 300, and destruction of each test controller can be performed as described with respect to FIGS. 3-4. In implementations where the test controller is connected to the device circuitry by testing interconnections that include fuses, the fuses can be blown at operation 530 prior to destruction of the test controllers. Alternatively, the fuses could be blown at operation 520 upon completion of testing.

In operation 540, the semiconductor wafer 502 is diced, resulting in individual dies that undergo final testing and packaging at operation 550 in a conventional manner to form a packaged semiconductor device 508. The laser 506 used in operation 540 can be the same laser used in operation 530 or a different laser.

Figure 6:
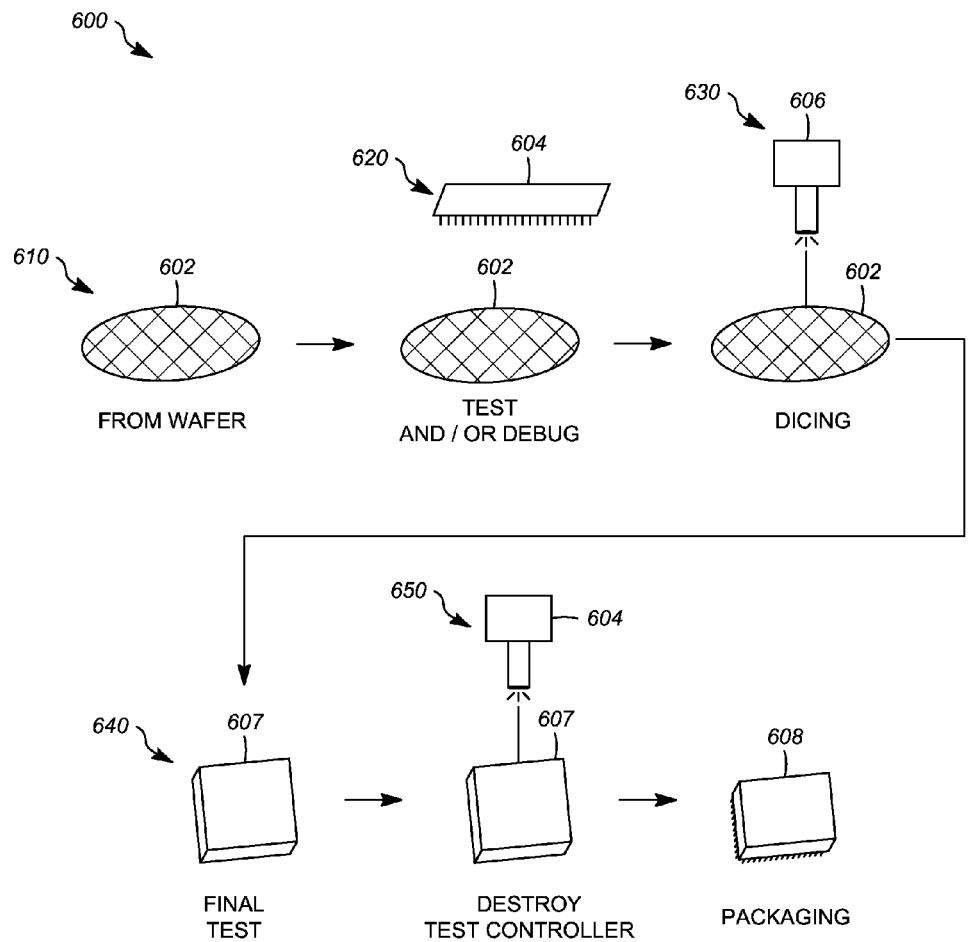
FIG. 6 is an illustration showing a process for forming and processing a semiconductor wafer according to a second example.

FIG. 6 is an illustration showing a process 600 for forming and processing a semiconductor wafer 602 according to a first example. In operation 610, the semiconductor wafer 602 is formed in a conventional manner. The semiconductor wafer 602 includes a plurality of integrated circuit devices such the integrated circuit device 100, each having device circuitry disposed in a device circuitry area on a substrate and a test controller formed in a destroyable circuitry area on the substrate.

In operation 620, at least one operational aspect of the device circuitry of each of the integrated circuit devices of the semiconductor wafer 602 is tested using the test controller of the respective one of the integrated circuit devices. In particular, automatic test equipment (ATE) 604 is connected to the test controller of each device on the semiconductor wafer 602 using test probes of the ATE 604 to engage probe pads on each device that interface with the input/output ports of each test controller. Electrical power and appropriate inputs are supplied to the test controllers by the ATE 604, and outputs are passed to the ATE 604 by the test controllers in response.

In operation 630, the semiconductor wafer 602 is diced using a laser 606, resulting in individual dies 607. The laser 606 can be equivalent to the laser 300, as previously described. Each of the individual dies 607 can undergo final testing at operation 640 subsequent to dicing, and prior to destruction of the test controller of each of the individual dies 607.

In operation 650, the test controllers of the individual dies 607 are destroyed using the laser 606. The laser 606 used for destruction of the test controllers at operation 650 can be the same laser used for dicing at operation 630 or can be a different laser. Destruction of each test controller can be performed as described with respect to FIGS. 3-4. In implementations where the test controller is connected to the device circuitry by testing interconnections that include fuses, the fuses can be blown at operation 650 prior to destruction of the test controllers. Alternatively, the fuses could be blown at operation 620 upon completion of testing. Packaging is performed at operation 660 in a conventional manner to form a packaged semiconductor device 608.

FIGS. 7-18 show illustrations in which the input/output terminals 211 and/or the TAP controller 210 are located in a destroyable circuitry area (i.e. an area of the device in which laser ablation will be performed to destroy one or more structures), and are connected to the device circuitry 120 by a respective example of an isolation cell. The isolation cells shown in FIGS. 7-18 can be incorporated in the integrated circuit device 100 described with respect to FIGS. 1-2.

Figure 7:
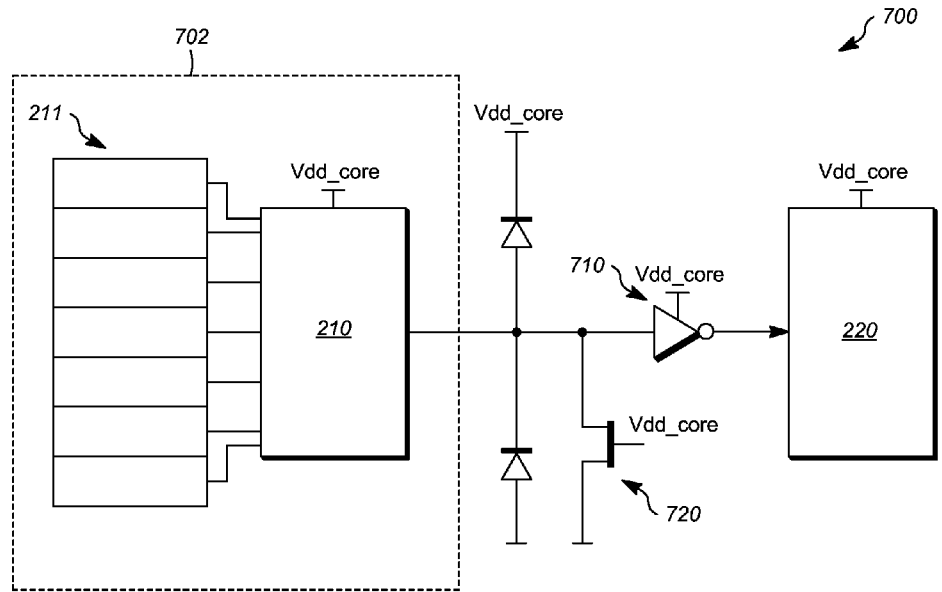
FIG. 7 is an illustration showing an isolation cell according to a first example.

FIG. 7 is an illustration showing an isolation cell 700 according to a first example. The TAP controller 210 and the input/output terminals 211 are located in a destroyable circuitry area 702. The isolation cell 700 incorporates an I/O device 710 and a weak pulldown 720.

Figure 8:
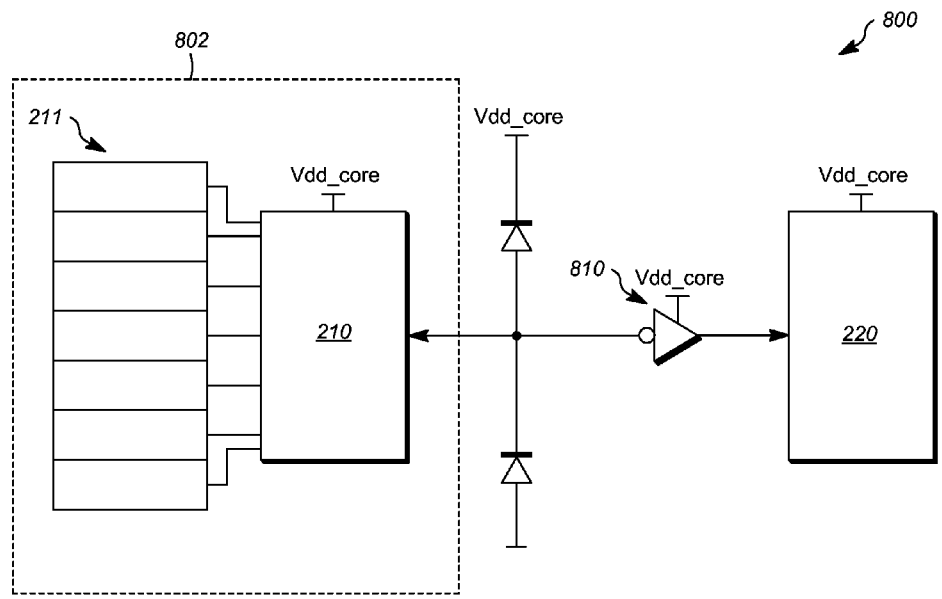
FIG. 8 is an illustration showing an isolation cell according to a second example.

FIG. 8 is an illustration showing an isolation cell 800 according to a second example. The TAP controller 210 and the input/output terminals 211 are located in a destroyable circuitry area 802. The isolation cell 800 incorporates an I/O device 810.

Figure 9:
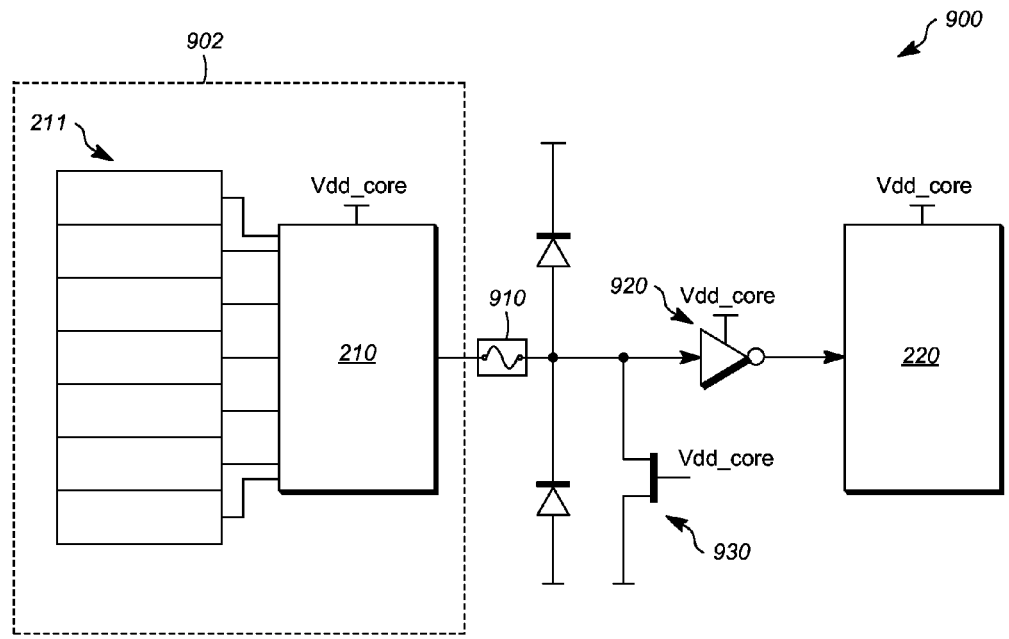
FIG. 9 is an illustration showing an isolation cell according to a third example.

FIG. 9 is an illustration showing an isolation cell 900 according to a third example. The TAP controller 210 and the input/output terminals 211 are located in a destroyable circuitry area 902. The isolation cell 900 incorporates an e-fuse 910, an I/O device 920, and a weak pulldown 930.

Figure 10:
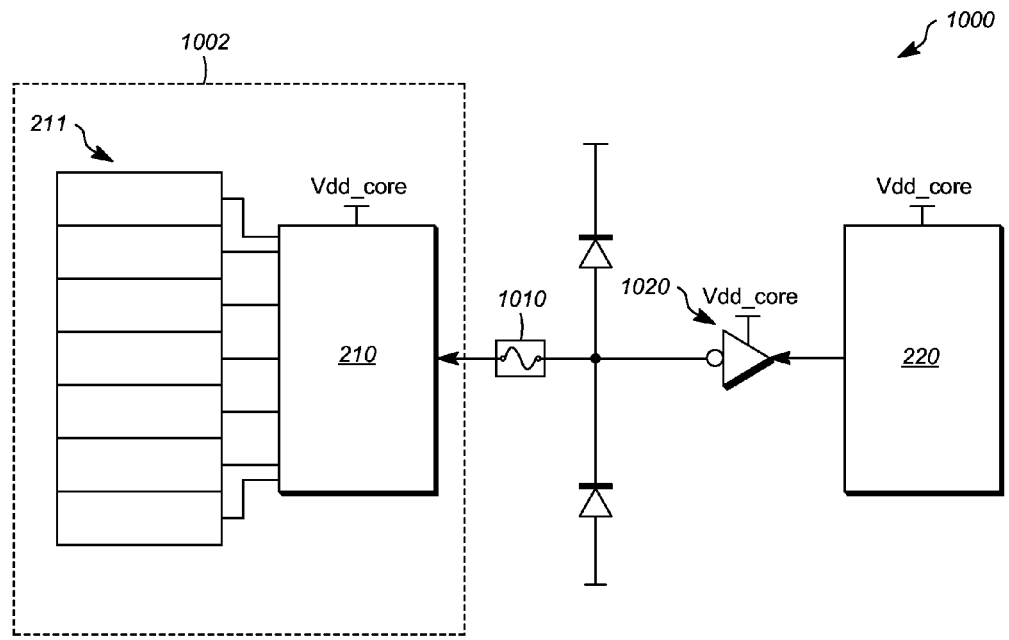
FIG. 10 is an illustration showing an isolation cell according to a fourth example.

FIG. 10 is an illustration showing an isolation cell 1000 according to a fourth example. The TAP controller 210 and the input/output terminals 211 are located in a destroyable circuitry area 1002. The isolation cell 1000 incorporates an e-fuse 1010 and an I/O device 1020.

Figure 11:
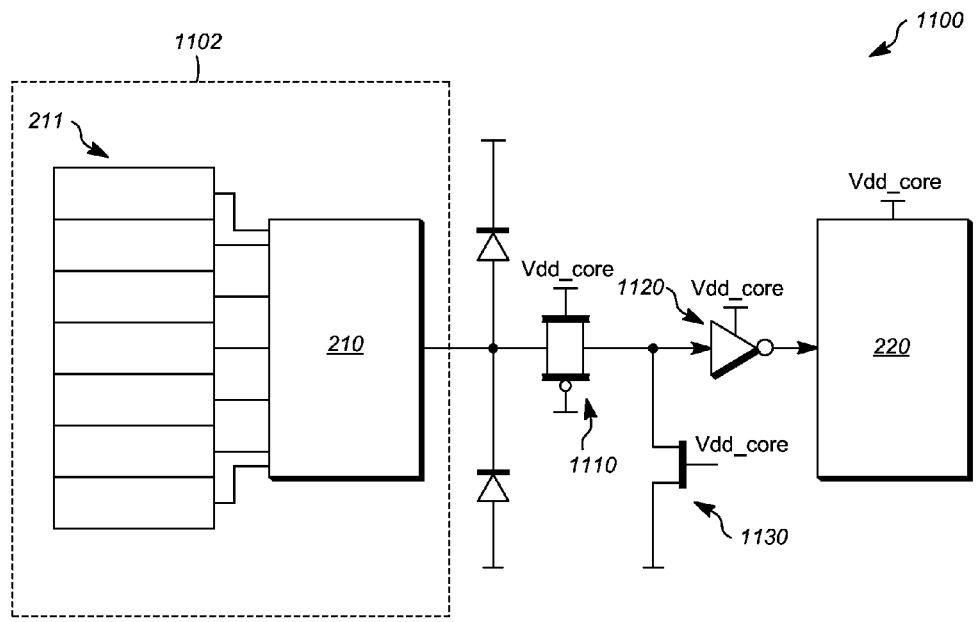
FIG. 11 is an illustration showing an isolation cell according to a fifth example.

FIG. 11 is an illustration showing an isolation cell 1100 according to a fifth example. The TAP controller 210 and the input/output terminals 211 are located in a destroyable circuitry area 1102. The isolation cell 1100 incorporates a pass-gate 1110, an I/O device 1120, and a weak pulldown 1130.

Figure 12:
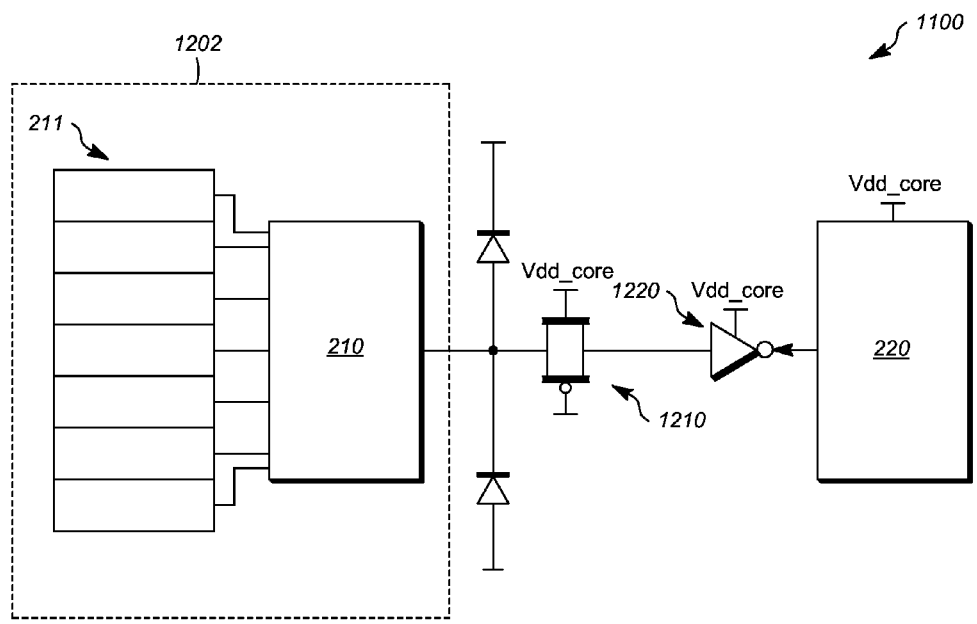
FIG. 12 is an illustration showing an isolation cell according to a sixth example.

FIG. 12 is an illustration showing an isolation cell 1200 according to a sixth example. The TAP controller 210 and the input/output terminals 211 are located in a destroyable circuitry area 1202. The isolation cell 1200 incorporates a pass-gate 1210 and an I/O device 1220.

Figure 13:
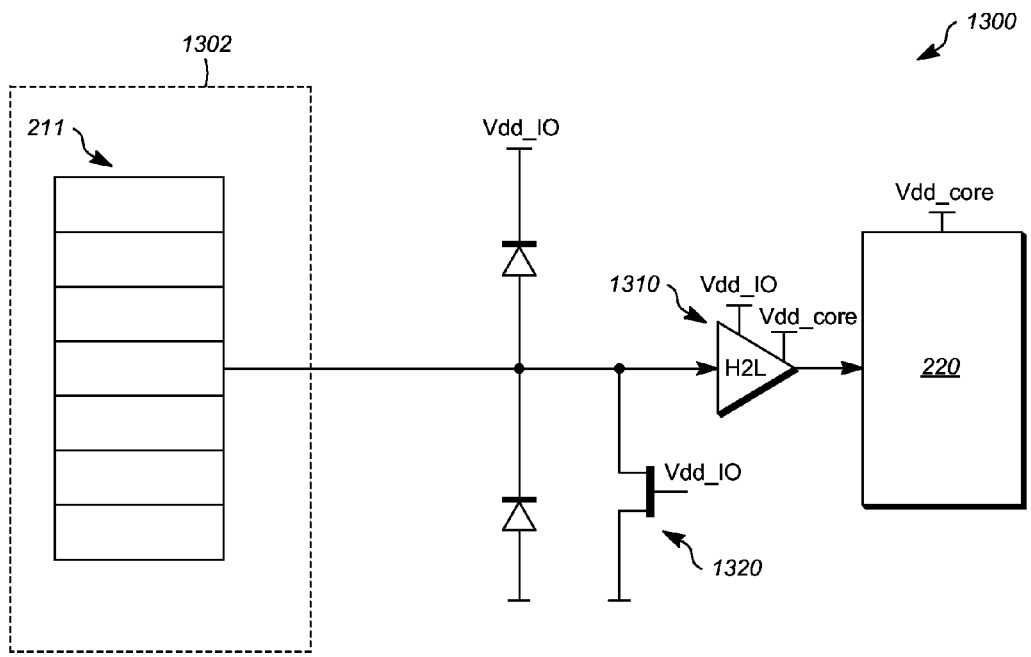
FIG. 13 is an illustration showing an isolation cell according to a seventh example.

FIG. 13 is an illustration showing an isolation cell 1300 according to a seventh example. The input/output terminals 211 are located in a destroyable circuitry area 1302. The isolation cell 1300 incorporates a high-to-low inverter 1310 and a weak pulldown 1320.

Figure 14:
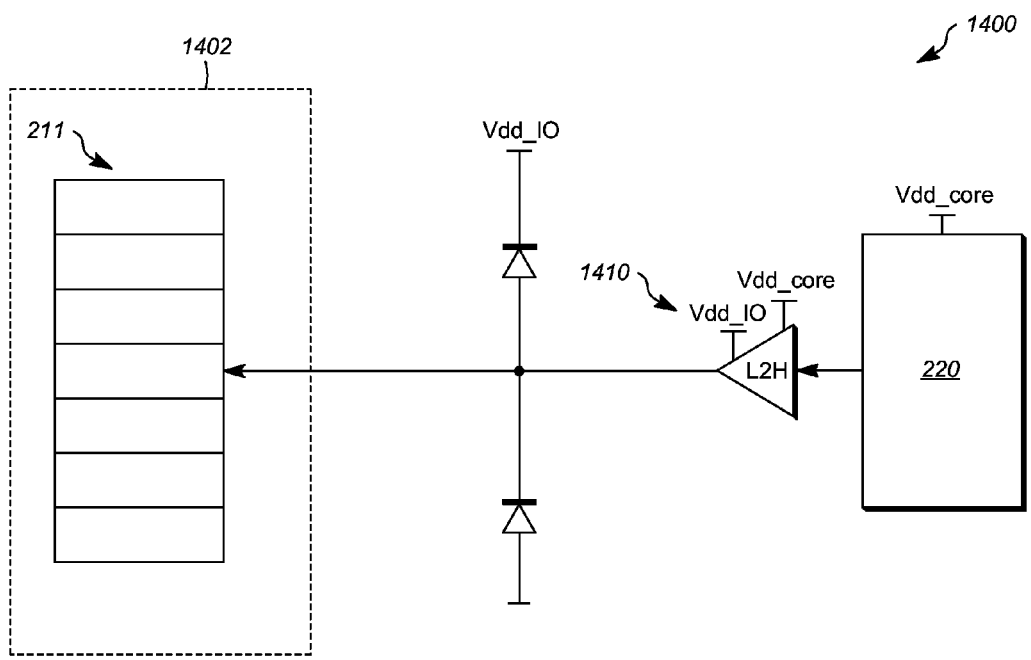
FIG. 14 is an illustration showing an isolation cell according to an eighth example.

FIG. 14 is an illustration showing an isolation cell 1400 according to an eighth example. The input/output terminals 211 are located in a destroyable circuitry area 1402. The isolation cell 1400 incorporates a low-to-high inverter 1410.

Figure 15:
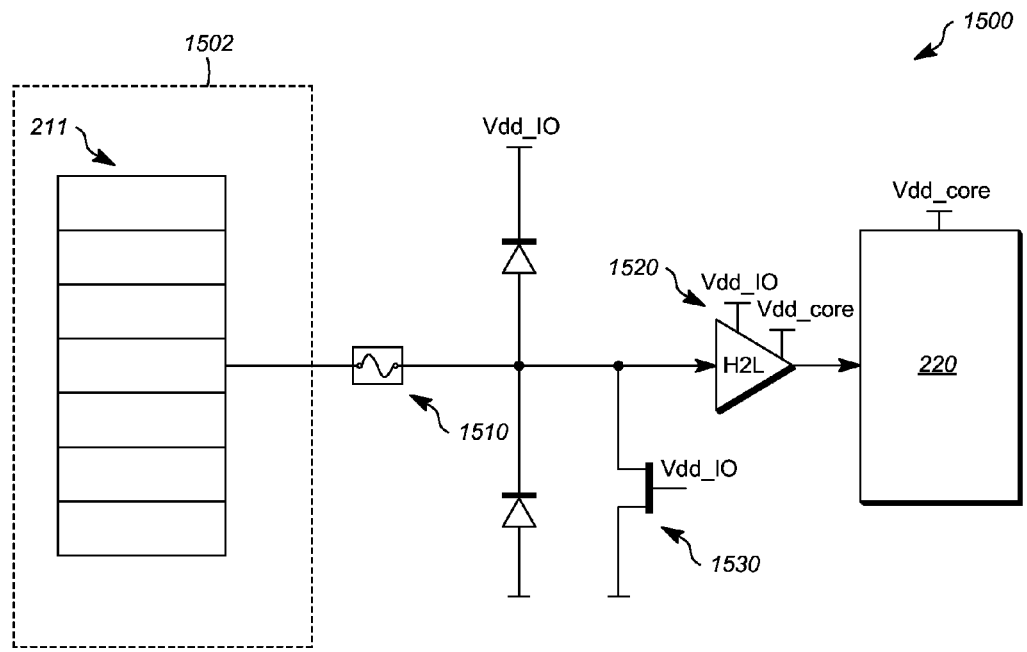
FIG. 15 is an illustration showing an isolation cell according to a ninth example.

FIG. 15 is an illustration showing an isolation cell 1500 according to a ninth example. The input/output terminals 211 are located in a destroyable circuitry area 1502. The isolation cell 1500 incorporates an e-fuse 1510, a high-to-low inverter 1520, and a weak pulldown 1530.

Figure 16:
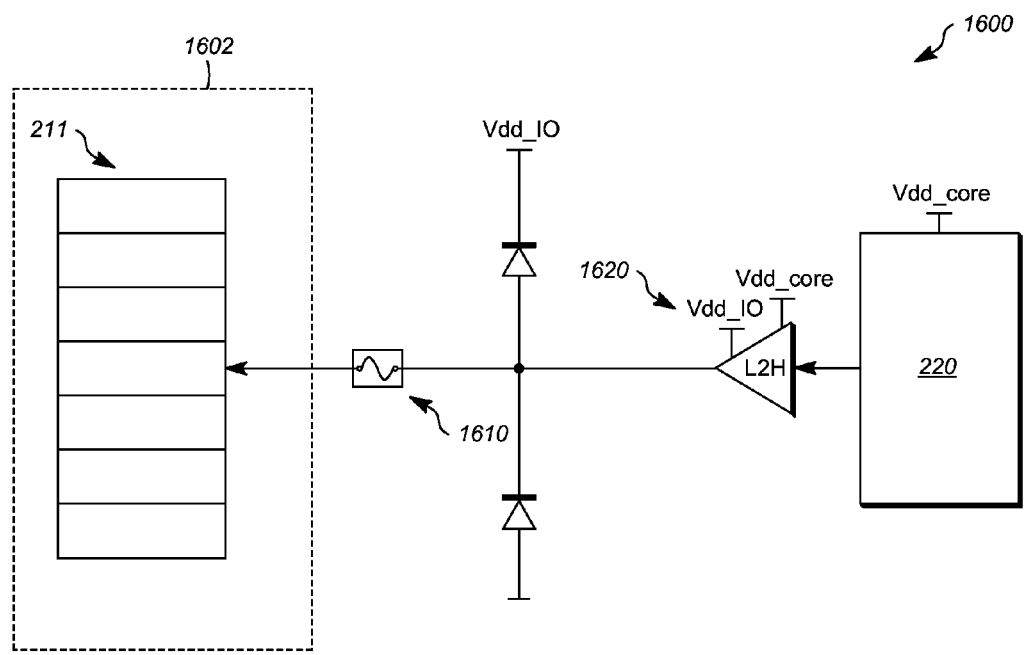
FIG. 16 is an illustration showing an isolation cell according to a tenth example.

FIG. 16 is an illustration showing an isolation cell 1600 according to a tenth example. The input/output terminals 211 are located in a destroyable circuitry area 1602. The isolation cell 1600 incorporates an e-fuse 1610 and a low-to-high inverter 1620.

Figure 17:
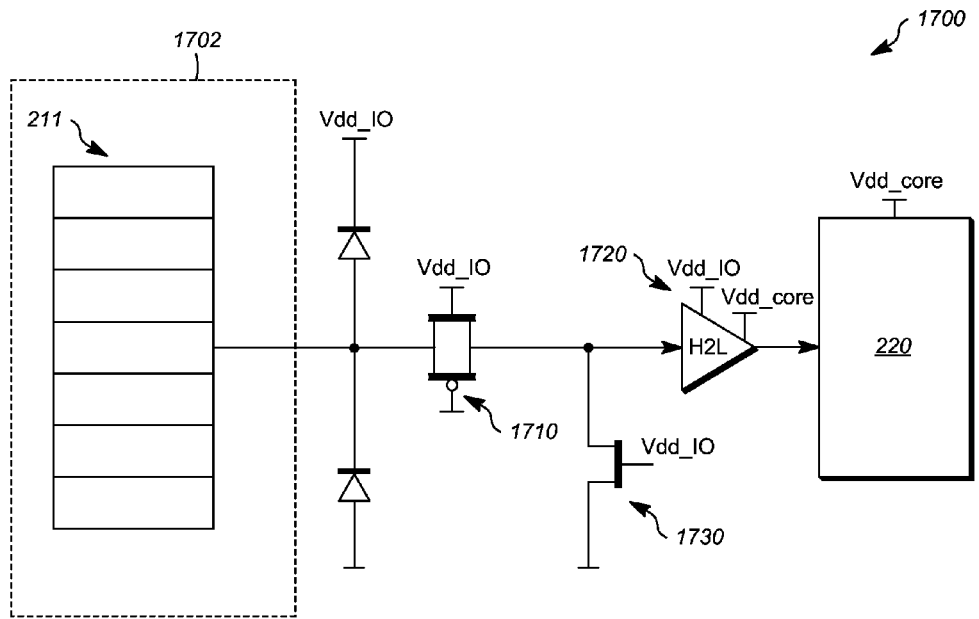
FIG. 17 is an illustration showing an isolation cell according to an eleventh example.

FIG. 17 is an illustration showing an isolation cell 1700 according to an eleventh example. The input/output terminals 211 are located in a destroyable circuitry area 1702. The isolation cell 1700 incorporates a pass-gate 1710, a high-to-low inverter 1720, and a weak pulldown 1730.

Figure 18:
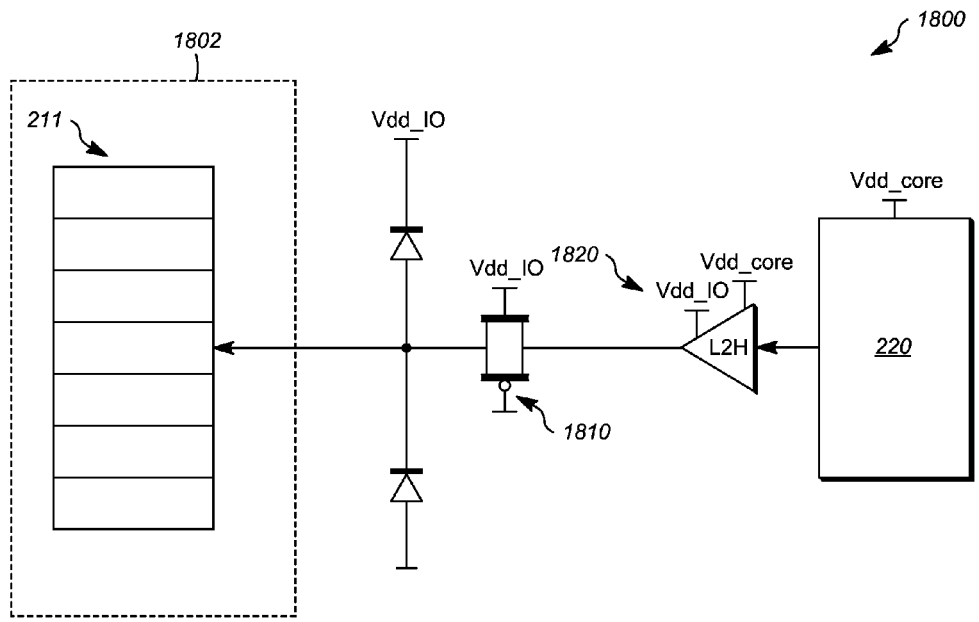
FIG. 18 is an illustration showing an isolation cell according to a twelfth example.

FIG. 18 is an illustration showing an isolation cell 1800 according to a twelfth example. The input/output terminals 211 are located in a destroyable circuitry area 1802. The isolation cell 1800 incorporates a pass-gate 1810 and a low-to-high inverter 1820.

The foregoing description describes only some exemplary implementations of the described techniques. Other implementations are available. Also, the particular division of functionality between the various system components described herein is merely exemplary, and not mandatory; functions performed by a single system component may instead be performed by multiple components, and functions performed by multiple components may instead performed by a single component.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Although features may be described above or claimed as acting in certain combinations, one or more features of a combination can in some cases be excised from the combination, and the combination may be directed to a sub-combination or variation of a sub-combination.

Computer implemented aspects of the systems described herein can be implemented using general purpose computers/ processors with a computer program that, when executed, carries out any of the respective methods, algorithms and/or instructions described herein. In addition or alternatively, for example, special purpose computers/processors can be utilized which can contain specialized hardware for carrying out any of the methods, algorithms, or instructions described herein.

It is to be understood that the disclosure is not to be limited to the disclosed embodiments but, on the contrary, is intended to cover various modifications and equivalent arrangements included within the spirit and scope of the appended claims.

What is claimed is:

1. A method comprising:
   forming an integrated circuit device having device circuitry disposed in a device circuitry area on a substrate and a destroyable circuit formed in a destroyable circuitry area on the substrate;
   testing at least one operational aspect of the device circuitry using the destroyable circuit; and
   destroying the destroyable circuit by removing at least a portion of the destroyable circuit from the substrate without destroying the substrate within the destroyable circuitry area subsequent to testing the at least one operational aspect of the device circuitry.

2. The method of claim 1, wherein destroying the destroyable circuit subsequent to testing the at least one operational aspect of the device circuitry is performed by laser ablation within the destroyable circuitry area.

3. The method of claim 2, wherein destroying the destroyable circuit subsequent to testing the at least one operational aspect of the device circuitry includes complete removal of a conductive interconnect layer of the destroyable circuit from the substrate.

4. The method of claim 2, wherein destroying the destroyable circuit subsequent to testing the at least one operational aspect of the device circuitry includes complete removal of the destroyable circuit from the substrate.

5. The method of claim 1, wherein the destroyable circuit is connected to the device circuitry by a plurality of testing interconnections.

6. The method of claim 5, wherein each testing interconnection includes a fuse.

7. The method of claim 1, wherein testing at least one operational aspect of the device circuitry using the destroyable circuit includes engaging a plurality of probes of a testing apparatus with a corresponding plurality of probe pads that are associated with the testing controller.

8. A method comprising:
   forming an integrated circuit device having device circuitry disposed in a device circuitry area on a substrate and a destroyable circuit formed in a destroyable circuitry area on the substrate, wherein forming the integrated circuit device includes defining a sacrificial gap that separates the destroyable circuitry area and the device circuitry area;
   testing at least one operational aspect of the device circuitry using the destroyable circuit; and
   destroying the destroyable circuit subsequent to testing the at least one operational aspect of the device circuitry.

9. The method of claim 8, wherein the integrated circuit device includes a seal ring, and at least part of the sacrificial gap is disposed adjacent to the seal ring to separate the destroyable circuit from the seal ring.

10. A method comprising:
    forming an integrated circuit device having device circuitry disposed in a device circuitry area on a substrate and a destroyable circuit formed in a destroyable circuitry area on the substrate, wherein the destroyable circuit is connected to the device circuitry by a plurality of testing interconnections and each testing interconnection includes a fuse;
    testing at least one operational aspect of the device circuitry using the destroyable circuit;
    destroying the destroyable circuit subsequent to testing the at least one operational aspect of the device circuitry; and
    blowing the fuse of each testing interconnection prior to destroying the destroyable circuit.

11. A method comprising:
forming an integrated circuit device having device circuitry disposed in a device circuitry area on a substrate and a destroyable circuit formed in a destroyable circuitry area on the substrate;
testing at least one operational aspect of the device circuitry using the destroyable circuit;
destroying the destroyable circuit subsequent to testing the at least one operational aspect of the device circuitry; and
dicing a semiconductor wafer including the integrated circuit device subsequent to destroying the destroyable circuit.

12. A method comprising:
forming an integrated circuit device having device circuitry disposed in a device circuitry area on a substrate and a destroyable circuit formed in a destroyable circuitry area on the substrate;
testing at least one operational aspect of the device circuitry using the destroyable circuit;
destroying the destroyable circuit subsequent to testing the at least one operational aspect of the device circuitry; and
dicing a semiconductor wafer including the integrated circuit device subsequent to testing at least one operational aspect of the device circuitry and prior to destroying the destroyable circuit.

13. A method comprising:
forming a semiconductor wafer that includes a plurality of integrated circuit devices having device circuitry disposed in a device circuitry area on a substrate and a destroyable circuit formed in a destroyable circuitry area on the substrate;
testing at least one operational aspect of the device circuitry of each of the integrated circuit devices using the destroyable circuit of the respective one of the integrated circuit devices; and
destroying the destroyable circuit of each of the integrated circuit devices by removing at least a portion of the destroyable circuit from the substrate without destroying the substrate within the destroyable circuitry area subsequent to testing the at least one operational aspect of the device circuitry.

14. The method of claim 13, wherein destroying the destroyable circuit subsequent to testing the at least one operational aspect of the device circuitry is performed by laser ablation within the destroyable circuitry area.

15. The method of claim 14, wherein destroying the destroyable circuit subsequent to testing the at least one operational aspect of the device circuitry includes complete removal of a conductive interconnect layer of the destroyable circuit from the substrate.

16. The method of claim 14, wherein destroying the destroyable circuit subsequent to testing the at least one operational aspect of the device circuitry includes complete removal of the destroyable circuit from the substrate.

17. A method comprising:
forming a semiconductor wafer that includes a plurality of integrated circuit devices having device circuitry disposed in a device circuitry area on a substrate and a destroyable circuit formed in a destroyable circuitry area on the substrate, wherein forming each integrated circuit device includes defining a sacrificial gap that separates the destroyable circuitry area and the device circuitry area;
testing at least one operational aspect of the device circuitry of each of the integrated circuit devices using the destroyable circuit of the respective one of the integrated circuit devices; and
destroying the destroyable circuit of each of the integrated circuit devices subsequent to testing the at least one operational aspect of the device circuitry.

18. The method of claim 17, wherein the integrated circuit device includes a seal ring, and at least part of the sacrificial gap is disposed adjacent to the seal ring to separate the destroyable circuit from the seal ring.

19. A method comprising:
forming a semiconductor wafer that includes a plurality of integrated circuit devices having device circuitry disposed in a device circuitry area on a substrate and a destroyable circuit formed in a destroyable circuitry area on the substrate, wherein the destroyable circuit is connected to the device circuitry by a plurality of testing interconnections, and each testing interconnection includes a fuse;
testing at least one operational aspect of the device circuitry of each of the integrated circuit devices using the destroyable circuit of the respective one of the integrated circuit devices;
destroying the destroyable circuit of each of the integrated circuit devices subsequent to testing the at least one operational aspect of the device circuitry; and
blowing the fuse of each testing interconnection prior to destroying the destroyable circuit.

20. A method comprising:
forming a semiconductor wafer that includes a plurality of integrated circuit devices having device circuitry disposed in a device circuitry area on a substrate and a destroyable circuit formed in a destroyable circuitry area on the substrate;
testing at least one operational aspect of the device circuitry of each of the integrated circuit devices using the destroyable circuit of the respective one of the integrated circuit devices;
destroying the destroyable circuit of each of the integrated circuit devices subsequent to testing the at least one operational aspect of the device circuitry; and
dicing the semiconductor wafer including the integrated circuit device subsequent to destroying the destroyable circuit.

* * * * *